US006256360B1

(12) United States Patent
Wilhelmsson et al.

(10) Patent No.: US 6,256,360 B1
(45) Date of Patent: Jul. 3, 2001

(54) METHOD FOR REDUCING TRANSIENTS IN A CLOCK SIGNAL GENERATING SYSTEM

(75) Inventors: Mats Göran Wilhelmsson, Hägersten; Clarence Jörn Niklas Fransson, Älvsjö, both of (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/085,027

(22) Filed: May 28, 1998

Related U.S. Application Data

(63) Continuation of application No. PCT/SE96/01318, filed on Oct. 16, 1996.

(30) Foreign Application Priority Data

Nov. 30, 1995 (SE) .................................................... 9504297

(51) Int. Cl.[7] .................................................... H04L 7/00
(52) U.S. Cl. .................................. 375/354; 370/503
(58) Field of Search .............................. 375/354, 356, 375/371, 318, 345, 349, 226, 260, 259, 377; 370/503, 516; 327/141, 144

(56) References Cited

U.S. PATENT DOCUMENTS

| 4,316,059 | * | 2/1982 | Toth . | |
|---|---|---|---|---|
| 4,502,018 | * | 2/1985 | Blomley . | |
| 4,651,103 | | 3/1987 | Grimes . | |
| 4,672,299 | | 6/1987 | Grimes et al. . | |
| 5,475,719 | | 12/1995 | Gürtler et al. . | |
| 5,577,086 | * | 11/1996 | Fujimoto et al. | 375/376 |

FOREIGN PATENT DOCUMENTS 0 175 888   4/1986   (EP) .

OTHER PUBLICATIONS

Takahashi, Y. et al., "Precise Clock Distribution for Synchronous Broadband Transmission Network", *IEEE*, p965, 1988.

* cited by examiner

*Primary Examiner*—Chi Pham
*Assistant Examiner*—Jean Corrielus
(74) *Attorney, Agent, or Firm*—Burns, Doane, Swecker & Mathis, L.L.P.

(57) ABSTRACT

Methods reduce transients in a redundant clock system forming part of a switch in a telecommunication network. In general, the transients, normally in the form of phase steps, are caused by reconfigurations in the clock system. Examples of reconfiguration are an inclusion or an exclusion of a redundant clock generating circuit, referred to as a plane, or an activation of a network synchronization. These transients are eliminated by successively adding an increment to a variable representative of a physical quantity in the clock generating system. In the case of an inclusion of a plane or an activation of the network synchronization, a positive increment is successively added to the gain of an amplifier. In the case of an exclusion of a plane, an increment is successively added to a phase difference representing signal.

18 Claims, 11 Drawing Sheets

METHOD FOR REDUCING TRANSIENTS IN A CLOCK SIGNAL GENERATING SYSTEM

This application is a continuation of International Application No. PCT/SE96/01318, which was filed on Oct. 16, 1996, which designated the United States, and which is expressly incorporated here by reference.

BACKGROUND

The present invention relates to telecommunication networks, and more particularly to the reduction of transients in a clock generating system.

A telecommunication network basically comprises switches S or equivalents, physical links interconnecting said switches, and various auxiliary devices (FIG. 1). Normally, a telecommunication system would be implemented with more switches and trunk groups than is illustrated in FIG. 1. However, for simplicity, the present invention will be explained using the simplified representations of FIG. 1. A switch S generally comprises a number of circuits, both analog and digital circuits, which are mounted on circuit boards that are stored in cabinets. A physical link utilizes transmission equipment, such as fiber optic conductors, coaxial cables or radio links. In general, physical links are grouped into trunk groups TG which extend between said switches. There are access points to the physical network, to which access points, access units such as telephone sets and computer modems, are connected.

A switch S normally includes a clock generating system which provides the digital circuits in the switch with clock signals. To meet the requirements on safety and reliability and to increase the mean time between system failure (MTBSF), the clock generating system should be redundant. Redundancy in the clock generating system is ensured by using multiple clock generating units. The unit which generates the clock signal is manifold; usually duplicated or triplicated. These units or boards are referred to as clock signal generating planes.

In general, the clock generating system can be of the type master-slave or a mutually regulating clock generating system. In a clock generating system of the type master-slave, one clock signal generating plane acts master, and the clock signals of the other clock signal generating planes, the slaves, are normally synchronized to the clock signal of the master plane. In a mutually regulating clock system, all the clock signal generating planes are synchronized with each other in frequency as well as in phase. The synchronization between the clock signal generating planes is generally effectuated by a regulation system. Since the clock signals of all the planes are regulated towards each other, the regulation is referred to as mutual regulation.

A mutually regulating clock system has a natural readiness or preparedness when a malfunction occurs or when a plane in the clock system is pulled out from a cabinet. If, in a master-slave type of clock system, a fault or malfunction occurs in the master, a reconfiguration has to be performed quickly. The administration of this reconfiguration is a difficulty that is avoided in a mutual clock system. A mutual regulation between the planes makes it possible to have identical planes regarding both hardware as well as software. In the following, what is generally under consideration is a mutually regulating clock generating system.

The clock signal generating planes should also be synchronized with an external reference signal. This is referred to as network synchronization. If the switch is not synchronized to incoming data, slip may occur in the transmission and data will be lost. Disruptions in a data stream entering a switch which are generally caused by underflows or overflows are referred to as slips. Another reason for having network synchronization is that the output clock signal of one switch can act as reference clock signal to another switch. In this way, many switches may be connected in cascade.

When a switch is synchronized with the network reference, the requirements on how the phase of the clock signal of the switch may change in relation to the phase of the reference clock signal input to the switch, are high. The transfer function of a switch from input signal to output signal is standardized. There is also a measure called MRTIE (Maximum Relative Time Interval Error) which specifies how much the phase of the clock signal output from the switch may change in relation to the phase of the reference clock signal input to the switch, over a certain period of time. Other measures of the clock signal quality also exist.

If a clock generating plane is excluded from the clock system due to the actions of an operator or because of a malfunction, or if a plane is plugged into and subsequently included into the clock system, a reconfiguration of the clock system takes place. More precisely, an exclusion of a clock generating plane from the mutual regulation of the clock system, or an inclusion of a further plane into the mutual regulation of the clock system is referred to as a reconfiguration of the mutually regulating clock system. This kind of reconfiguration of the system may change the frequency for the whole system of mutually regulating planes; a transient will be introduced into the clock system. This transient will normally generate unacceptably large phase differences between the clock signal of the switch and the reference signal, which, in turn, will create transmission slip so that data will be lost. This is particularly so, when the filter circuit or regulator in the clock generating planes includes an amplifying unit, such as a proportionally amplifying block (by way of example: the proportional path P of a PI- or PID-regulator).

Normally, a similar problem is encountered in a mutually regulating clock system when the network synchronization is activated. When the clock signal generating planes of the mutually regulating clock system start to synchronize to a network reference signal, transients may be introduced into the clock system.

It is the provision of methods for reducing transients in a clock generating system to which the present invention is directed.

SUMMARY

A switch in a telecommunication network normally requires a clock generating system whose clock frequency controls the circuits of the switch. For reasons of reliability and safety, a redundant clock generating system is normally used. In general, a mutually regulating clock system is under consideration. If the clock generating system is synchronized with an external network reference, the requirements on how much the phase of the clock signal of the switch may change in relation to the phase of the reference signal input to the switch, are generally high. Reconfigurations in the clock signal generating system, such as an inclusion of a clock generating plane into the mutual regulation of the clock system, an exclusion of a plane from the mutual regulation of the clock system, or an activation of the network synchronization, may introduce transients, usually in the form of phase steps, into the system. This is particularly so when a proportional path or equivalent is provided in the regulator of the clock generating planes. These transients may seriously effect the operation of the switch.

In accordance with a general inventive concept, reconfiguration transients are reduced considerably by transforming the phase steps so that they are gradually and smoothly introduced into the clock system. This is generally accomplished by successively adding an increment to a variable representative of a physical quantity in the clock generating system. The increment may be positive as well as negative. Examples of physical quantities are the gain of an amplifier in a regulator of the clock system, and a phase difference representing signal. In general, each physical quantity is related to a separate aspect of the invention. In the case of an inclusion of a plane or an activation of the network synchronization, a positive increment is successively added to the gain of an amplifier; the gain is gradually incremented from, one value to another value over a period of time. In the case of an exclusion of a plane, if the measured signal immediately prior to exclusion is positive, then a negative increment is successively added to the phase difference representing signal; the signal is gradually decremented from one value to another value over a period of time. On the other hand, if the measured signal immediately prior to exclusion is negative, then a positive increment is successively added to the phase difference representing signal. In this way, the method according to the present invention transforms transients into smoothly changing signal processes which generate no transients at all or, at most, negligible transients.

In accordance with a first aspect of the present invention, there is provided a method for reducing transients caused by including a further clock signal generating plane into the clock generating system.

In accordance with a second aspect of the present invention, there is provided a method for reducing transients caused by excluding a clock signal generating plane from the clock generating system.

Furthermore, in accordance with yet another aspect of the present invention, there is provided a method for reducing transients caused by activating a network synchronization; i.e. by activating a synchronization of the clock signal of the clock system to a network reference clock signal.

The present invention offers the following advantages:

Clock system reconfiguration transients are eliminated or reduced considerably so that error free transmission of data in the telecommunication network is ensured;

The clock system is more tolerant to propagation delay differences of the cables, and individual variations of all involved components;

In a digital implementation of the regulating system, the present invention handles the reduction of transients with a minimum of processor power, since additions are the basic operations of a microprocessor.

BRIEF DESCRIPTION OF THE DRAWINGS

The novel features believed characteristic of the invention are set forth in the appended claims. The invention itself, however, as well as other features and advantages thereof will be best understood by reference to the detailed description of the specific embodiments which follows, when read in conjunction with the accompanying drawings, wherein:

DETAILED DESCRIPTION

Figure 1:
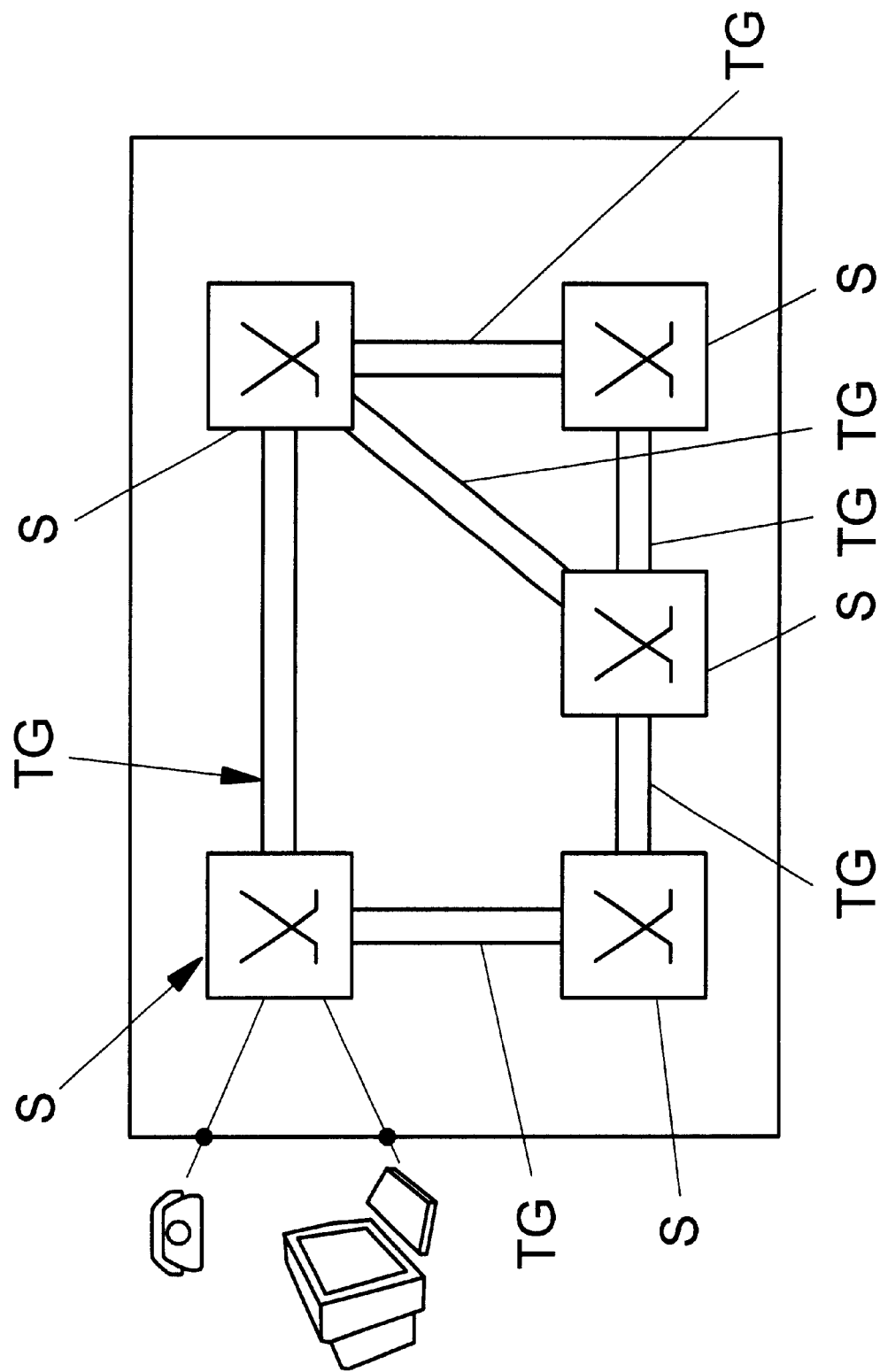
FIG. 1 is a schematic drawing illustrating a telecommunication network.
Figure 2:
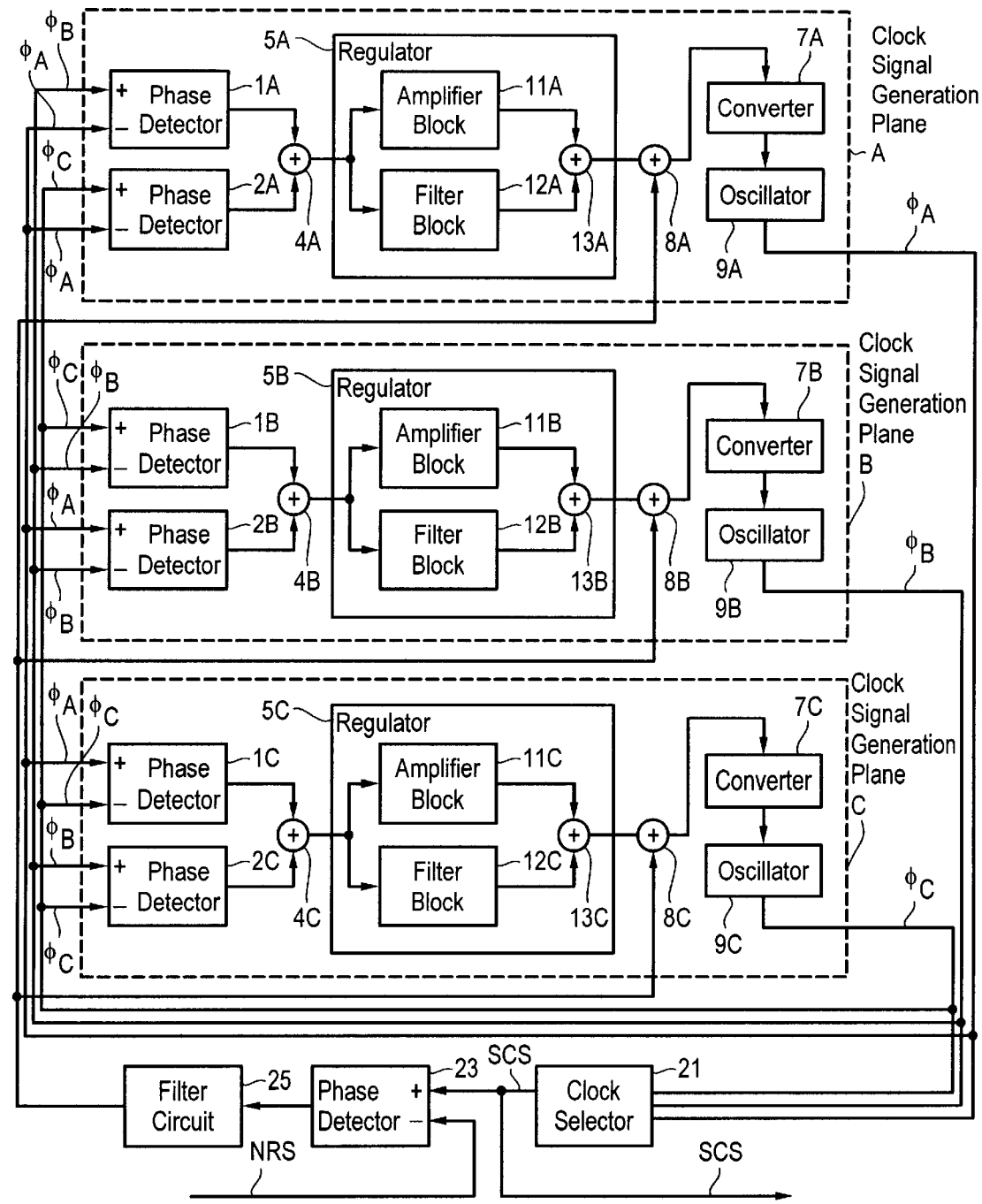
FIG. 2 is a schematic and simplified model of a clock generating system.

FIG. 2 is a schematic and simplified model of a clock generating system. At first, the physical configuration of the clock system will be described briefly. In this particular clock system, there are three clock signal generating planes, referenced A, B and C. Each clock signal generating plane basically comprises two phase detectors 1, 2, a filter circuit or regulator 5, a digital-to-analog converter 7 and an output signal source, preferably a voltage controlled oscillator 9, said components together forming a phase-locked loop arrangement. Identical reference numerals are used for like elements in each clock generating plane, but the common numeric portion of the reference numeral is followed by one of the letters "A" through "C" to identify an element in a specific clock generating plane. Thus, for example, the regulator of plane A is referred to as 5A, the regulator of plane B as 5B, and the regulator of plane C as 5C. A more general reference is made to an element without regard to the plane in which it is located, simply be referring to it using only the common numeric portion of the reference numeral, e.g. the regulator 5. The first phase detector 1, in each plane, is responsive to the output clock signal of its plane and to the output clock signal from a first one of the other planes in the clock system to generate a first phase difference representing error signal. The second phase detector 2, in each plane, is responsive to the output clock signal of its plane and to the output clock signal from a second one of the other planes in the clock system to generate a second phase difference representing error signal. Legends $\phi_A$, $\phi_B$ and $\phi_C$, refer to the phase of the clock signal of plane A, B and C, respectively. Preferably, the phase detectors are conventional counter-based digital phase detectors. In each plane, the first and second error signals are normally sent to a first summing block 4 which adds the two error signals. Next, the summed signal is sent to the regulator 5 which produces a digital control signal. The digital control signal is converted by the D/A-converter 7, and the resulting analog control signal is used to control the frequency of the output signal of the oscillator 9. The oscillator output signal is the output clock signal of the clock signal generating plane. The output clock signal from each one of the planes is distributed via a cross connection, or by cables, to all three clock generating planes, and the phase detectors 1, 2 in particular. FIG. 2 shows the clock system when all three clock generating planes are present and in function.

Preferably, the regulator S is implemented in software and executes in a microprocessor which operates at a predetermined sampling frequency. Normally, the regulator 5 comprises an amplifying block 11 and a low-pass filter block 12 connected in parallel. Both the amplifying block 11 and the low-pass filter block 12 are responsive to the summed signal, which is the sum of the two error signals, to produce an amplified signal and a low-pass filtered signal, respectively. The amplified signal and the low-pass filtered signal are added together in a summing block 13 to provide the digital control signal. In accordance with a preferred embodiment of the invention, the first summing block 4 is integrated into the regulator 5, and the two error signals are sent directly to the regulator 5. Sometimes, depending upon the particular application, the low-pass filter 12 is substituted by an integrator. The amplifying block 11 usually constitutes a proportional path, whereas the low-pass filter block 12 has a relatively long time constant. Note that, throughout the entire disclosure gains equal to or less than 1, but in general greater than zero, also are included in the expression "amplify".

If the phase detectors 1, 2 of all the planes are active, a completely mutually regulating clock system is obtained. The phase-locked loop arrangement of each plane synchronizes the clock signal of the plane with the clock signal of the respective one of the other planes in the clock generating system. In other words, plane A regulates towards plane B and C; plane B regulates towards plane A and C; and plane C regulates towards plane A and B. Of course, any pair of clock generating planes may constitute a mutually regulating subsystem of a clock system.

When the mutually regulating clock system is not affected by any external signals, temperature shifts or other external changes, the clock system will be found at the "natural" frequency and with "natural" phase differences, which are small or equal to zero, between the clock signals. The word "natural" is supposed to reflect that the frequency and the phase differences of the system are determined by the system itself, by the internal inherent characteristics of the individual clock system.

Furthermore, the output clock signals from the planes are distributed to a clock selector 21 which performs quality control of the clock signals, and then selects one of the clock signals in accordance with a predetermined pattern and the result of the quality control. The selected clock signal SCS is used as clock signal for the circuits and units residing in the switch. Normally, the clock selector 21 cyclically rotates between the three clock signals. In general, all of the circuits and functions of the switch are triplicated, and thus redundant. A general object of the redundancy is that the switch should be able to perfrormn switching of data although faults or malfunctions occur in the circuits of the switch. This redundancy for functions in the switch other than the clock signal generation have been omitted in FIG. 2 for reasons of simplicity and clarity. In practice, however, this means that by way of example there are normally three clock selectors in the switch, one for each clock generating plane. In addition, the switch itself may be duplicated or triplicated.

Figure 3:
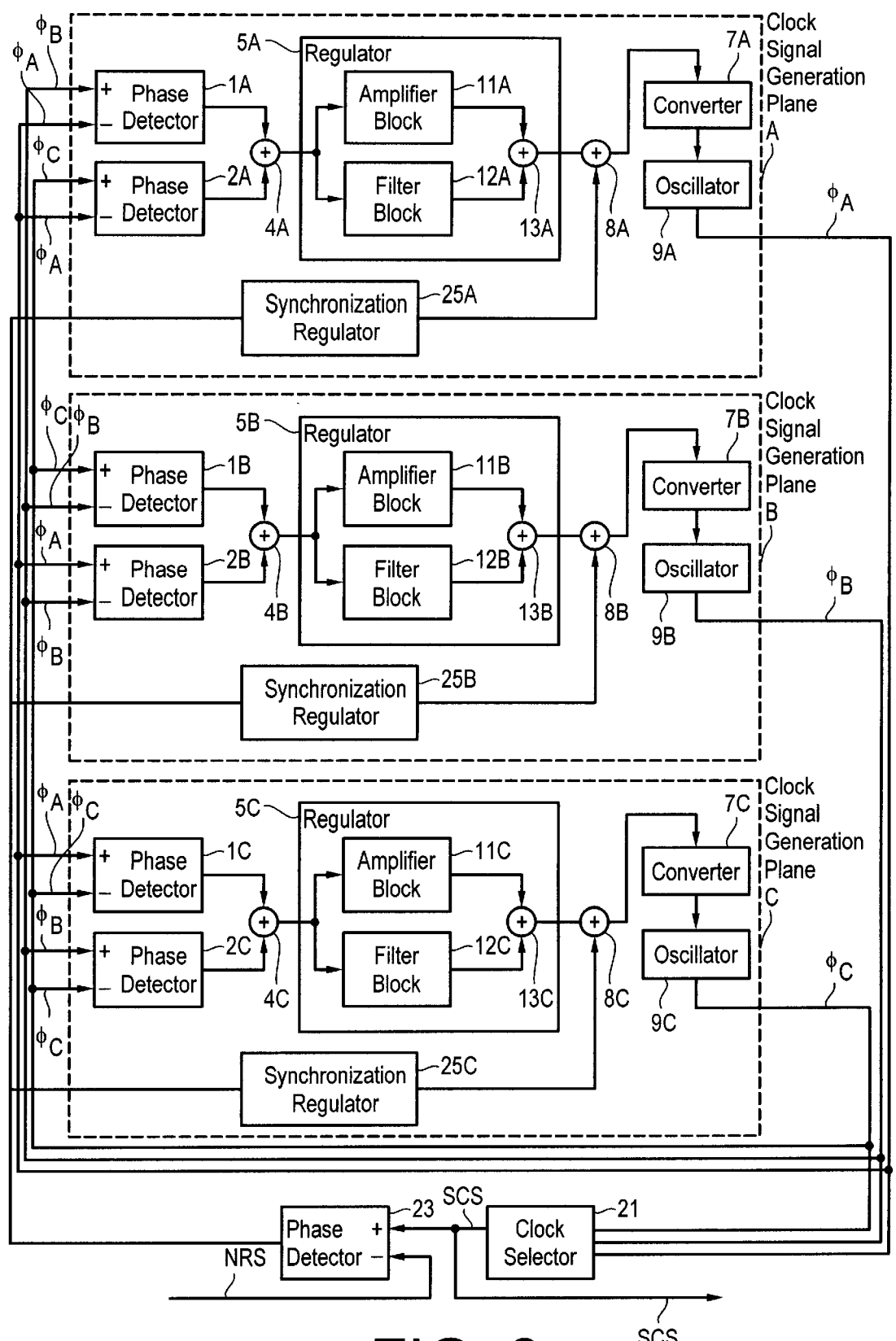
FIG. 3 is a schematic and simplified model of a clock generating system, in which each plane comprises a network synchronization regulator.

Normally, the switch has to be synchronized with incoming data, otherwise slip may occur in the transmission of data. In this so-called network synchronization, the selected clock signal SCS is synchronized with an external network reference signal NRS. A phase detector 23 receives the selected clock signal SCS and the reference signal NRS to produce a node error signal representative of the difference in phase between the two signals. A further regulator or filter circuit 25 receives this node error signal to produce a digital control signal for the network synchronization. This, so-called, digital network synchronization control signal is sent to a second summing block 8, in each clock generating plane, to influence the frequency of the output clock signal of the respective plane. The second summing block 8 is responsive to the output signal of the regulator 5 of the plane and the network synchronization control signal. In this way, the clock signal SCS of the clock selector 21 will be synchronized with the network reference signal NRS. In the practical implementation of the switch, there is one network synchronization regulator 25 implemented in each one of the planes, making up a total of three network synchronization regulators 25A, 25B and 25C (FIG. 3). In this latter embodiment, each one of the three network synchronization regulators 25 receives the node error signal from the phase detector 23.

It is important to understand that the preceding description of the switch in general, and the clock generating system in particular, is intended to serve merely as a framework for an understanding of the present invention, and that the invention is not limited thereto. By way of example, it should be understood by those skilled in the art that the clock generating system may, of course, be expanded with further clock generating planes; in fact the requirement for a redundant clock system is that there are at least two clock generating planes.

In general, a redundant clock system with a fixed number of clock signal generating planes is considered. It is also assumed that the clock system is synchronized with a network reference signal. If a fault or malfunction occurs in one of the planes, or if a plane fails completely, then this is detected by the system and the faulty plane is excluded from the mutual regulation of the clock system. Normally, this plane will be substituted by a new functioning plane. At first, the new plane, in the form of a circuit board, is physically plugged into the system. Subsequently, the clock signal of the new plane starts to lock to the clock signals of the planes in the original clock system, i.e. the planes which are already in a mutually regulating steady state operation. Finally, when the clock signal of the new plane is synchronized with the clock signal of the respective one of the original planes with a predetermined level of accuracy, the new plane is included into the mutual regulation of the clock system. Similar procedures may be performed when the clock system or parts thereof, e.g. one clock generating plane, is to be upgraded to a newer version.

In the following, four aspects of the present invention will be described:

1) Reduction of transients caused by including a further plane into the clock system;

2) Reduction of transients caused by excluding a plane from the clock system;

3) Handling transients caused by a number of closely successive inclusions and exclusions of clock generating planes;

4) Reduction of transients caused by activating a network reference synchronization.

1) If a further clock signal generating plane is to be included into the mutual regulation of a clock signal generating system, the inclusion can be performed according to the following example, which in no way is intended to limit the scope of the invention.

Initially, it is assumed that two clock generating planes, for example planes A and B, are interconnected in a cabinet, and that these planes are regulating mutually towards each other. Plane A and plane B constitute the original clock system. Moreover, the selected clock signal SCS of this clock system is synchronized with the external network reference signal NRS in frequency as well as in phase with a required level of accuracy. To enhance the redundancy further and to improve the fault detection possibilities, it is desirable to include a further plane, for example plane C, into the clock system. At first, plane C is plugged into the cabinet and connected to the clock system. Next, plane C immediately starts to regulate towards plane A and plane B, whereas neither plane A nor plane B regulates towards plane C since this would seriously disturb the original clock system. In this way, the clock signal of plane C starts to lock to the clock signal of plane A and the clock signal of plane B in frequency and phase. In plane A there is implemented a synchronization test, preferably in software executing in the microprocessor, which checks whether or not the phase difference between the clock signals of plane A and C is smaller than a predetermined value. If the phase difference between the clock signals of planes A and C have been smaller than this value for a certain period of time, then plane A starts to regulate towards plane C; plane A accepts plane C into a mutual regulation. Now, plane A and plane C regulate mutually towards each other, and plane A and plane B regulate mutually towards each other. A similar test is implemented in plane B, so that when the phase difference between the clock signals of plane B and C has been smaller than a predetermined value for a predetermined period of time, then plane B starts to follow plane C and not only plane A. When both plane A and plane B regulates not only towards each other but also towards plane C, then plane C has been included into the mutual regulation of the whole clock system. The moment in which plane A starts to regulate towards plane C, and also when plane B starts to regulate towards plane C, are critical moments for the whole clock system, since the configuration of the clock system is changed.

For a better understanding of what happens in the clock system when it is reconfigured, the transition from a first configuration, in which A follows B, B follows A, and C follows A and B, to a second configuration, in which A follows B and C, B follows A, and C follows A and B, will be studied in more detail below. The above transition means that plane A has accepted plane C into a mutual regulation between the two planes.

Prior to the transition from the first configuration to the second configuration, there is, in general, a remaining non-zero phase difference between the clock signal of plane A and the clock signal of plane C due to different aging characteristics of the oscillators, propagation delay differences of the cables, and individual variations of all involved components. This remaining phase difference, referred to as $\Delta\phi_{AC}$, is detected or measured by the second phase detector (2A in FIG. 2 or 3) of plane A. Assume that the clock system has reached steady state in the first configuration, so that the frequency of the clock signals as well as all the possible phase differences are stable in time. At the time of the reconfiguration, i.e. the transition between the first and second configuration, occurring at the time $t_0$, the remaining phase difference $\Delta\phi_{AC}$ will be introduced into the clock system, and more particularly into the regulator 5A of plane A, in the form of a phase step.

Assume, for reasons of simplicity, that the phase difference or phase step $\Delta\phi_{AC}$ remains constant in time, then the following will happen with the clock signal of plane A: First, since the regulator SA of the plane includes a proportional block 11A (see FIG. 2 or 3), the control signal to the VCO 9A in plane A is momentarily increased, at the time $t_0$, by a constant value $\Delta V$ which is determined by the magnitude of $\Delta\phi_{AC}$ and the gain, Kp, of the proportional block 11A; $\Delta V = \Delta\phi_{AC} \cdot Kp$. This step-like control signal contribution will generate a corresponding frequency shift for the clock signal of the VCO 9A in plane A. Second, the low-pass filter block 12A (FIG. 2) of the regulator 5A in plane A will also respond to the phase step $\Delta\phi_{AC}$. Denote the phase difference between the clock signals of plane A and B by $\Delta\phi_{AB}$. Immediately prior to the time $t_0$, the output signal of the low-pass filter block 12A is generally determined by the DC-gain of the filter 12A and the current phase difference $\Delta\phi_{AB}$. For times $t > t_0$, the low-pass filter output signal will gradually approach a value that is determined by the DC-gain of the filter 12A and the phase difference ($\Delta\phi_{AC} + \Delta\phi_{AB}$). The time required for the low-pass filter 12A to reach its new steady state value is determined by the time constant of the filter 12A. Consequently, at the time $t_0$, the proportional block 11A of the regulator 5A in plane A generates a frequency jump for the clock signal of the plane, whereas the low-pass filter block 12A of the regulator SA will generate a slower frequency change starting at time $t_0$ and ending some time later depending upon the particular time constant of the filter 12A.

However, in reality, the phase difference $\Delta\phi_{AC}$ is not constant in time, since the clock system is a complex and dynamic feedback system. The phase error $\Delta\phi_{AC}$ influences the frequency of the clock signal of plane A, thereby changing the phase of the clock signal of plane A. This phase change naturally influences all the phase differences in the clock system, thereby changing all the frequencies, which in turn will change all the phase differences, and so on. The only way to fully understand the dynamic behavior of the clock system, would be to use a simulation model or a mathematical model. If the clock system is a discrete-time system, then a model based on Z-transforms can be built. For the purpose of this disclosure, however, it is enough to consider the simplified, but intuitive picture of the behavior of the clock system which is created by assuming that $\Delta\phi_{AC}$ is constant in time.

A corresponding process will, of course, also take place when plane B accepts plane C.

In brief, at a reconfiguration of the clock system, remaining phase differences are introduced into the system in the form of phase steps which will generate transients. The clock system leaves its old frequency and starts to change its frequency towards a new frequency. A frequency shift for the whole clock system takes place.

When the clock system is in operation in a telecommunication switch, the clock system is normally synchronized with a network reference. At the time of an internal reconfiguration of the clock system, the frequency of the clock system will be altered as described above. The network synchronization regulation will try to compensate for this frequency shift. However, if the frequency shift for the clock signal of the clock system is very sudden, the network synchronization regulator 25 will have difficulties compensating for the abrupt frequency change. The time required to compensate for the frequency shift is determined by the time constant of the network synchronization regulator 25. In the worst case scenario, the frequency shift is too fast for the network synchronization regulator 25 so that quality measures like MRTIE are violated, and what is worse, transmission slip occurs. For this reason it is essential not to cause fast frequency changes for the clock signal of the clock system when changing the internal configuration of the clock system.

In general, the core of the problem is the proportional block 11 in the regulator 5, or an equivalent block which has a rather short time constant. In fact, any path or block in the plane regulator 5 which has a time constant that is shorter than the time constant of the network synchronization regulator 25 may cause problems with transients. The present invention, in all its aspects, is generally applicable to this type of problems and systems.

One way of overcoming the problem would be to low-pass filter the output signal of the proportional path 11 of the regulator 5; to connect a further low-pass filter to the output of the amplifying block 11. However, since the two error signals from the phase detectors 1, 2 in each plane normally are added together, and then sent into the regulator 5, the error signal from the phase detector which is responsive to the clock signals of the clock generating planes of the original clock generating system will also be influenced by this low-pass filtering of the output signal of the proportional path. This influence on the mutual regulation between the planes of the original clock system is undesirable. Therefore, a better solution would be to low-pass filter the error signal which is representative of the phase difference between the clock signal of the further included plane and the clock signal of the current plane. Unfortunately, this requires a significant amount of processor power, since low-pass filtering generally demands two multiplications for each sample. Consequently, this kind of solution is quite unsatisfactory when consideration is taken to the optimization of the required processor power in the switch.

In accordance with a first aspect of the present invention a better solution is provided by including an additional amplifying block connected to the output of the phase detector which is responsive to the clock signal of the further included plane and the clock signal of the current plane. The value of the gain of the additional amplifying block is set to zero at the time for the inclusion of the further plane, and a smooth transient-free inclusion of the further plane into the mutual regulation with the current plane is effectuated by successively adding a small increment to the value of the gain until it has reached the value of one. From a processor power optimization point of view, the solution according to the invention requires less operations in the processor than the low-pass filter solution.

Figure 4:
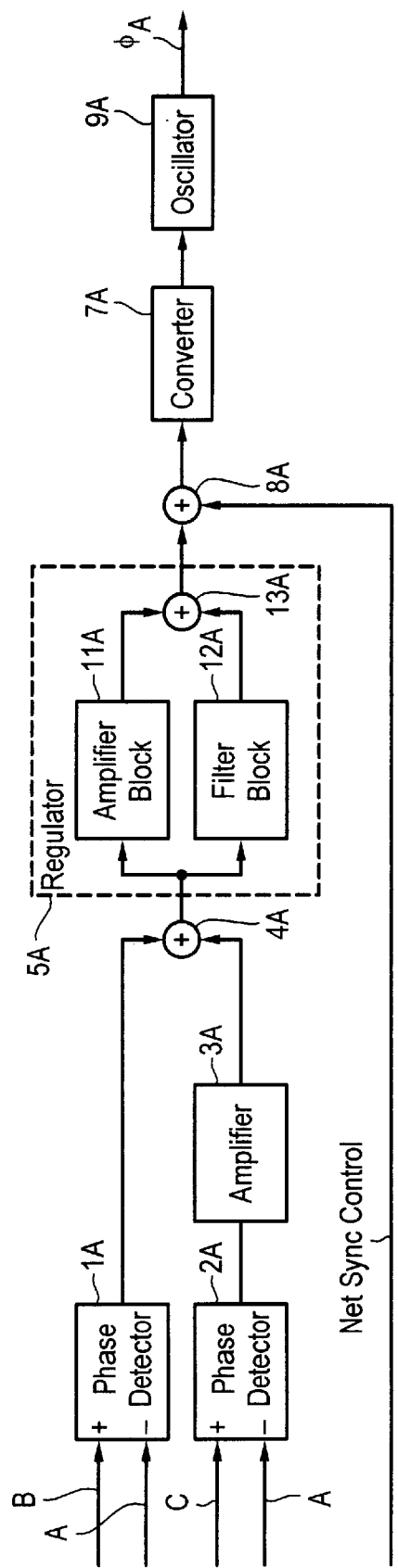
FIG. 4 is a schematic block diagram of a clock generating plane in accordance with the present invention, said plane comprising an additional amplifier.
Figure 5:
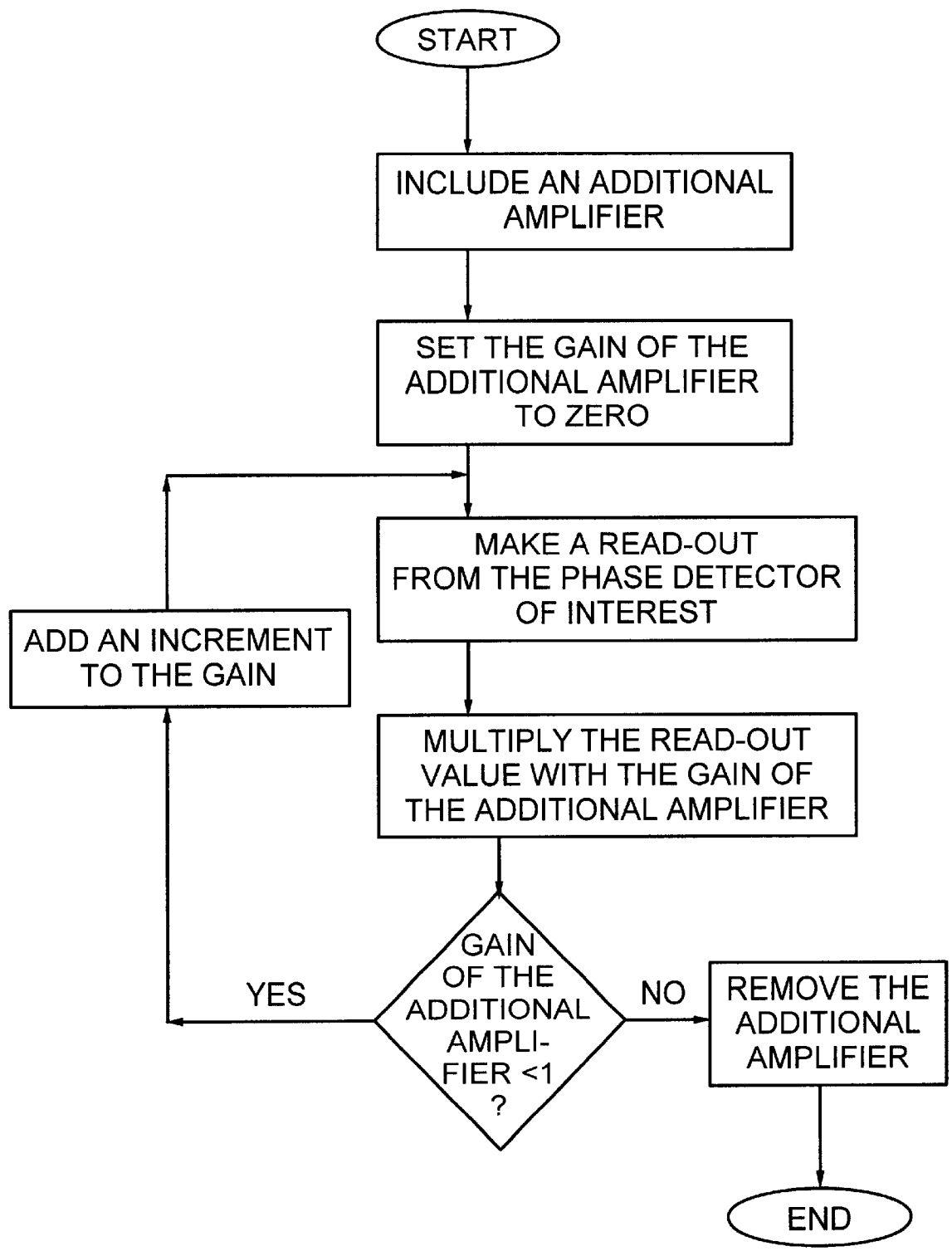
FIG. 5 is a schematic flow diagram illustrating a method for reducing transients in accordance with a first aspect of the invention.

FIG. 4 is a schematic block diagram of a clock generating plane (plane A in this example) in accordance with the present invention when an additional amplifier 3A is provided in the plane. The synchronization test described above, preferably software-implemented, checks whether or not a new plane, for example plane C, should be accepted into a mutual regulation with the current plane, for example plane A. When the current plane A is allowed to regulate towards the new plane C, the phase detector 2A in plane A which is to be responsive to the clock signals of plane A and C is activated, and an additional amplifier 3A is connected between the output of the phase detector 2A and the summing block 4A. In accordance with a preferred embodiment of the invention, at the time for the inclusion or acceptance of the new plane C into a mutual regulation between the new plane C and the current plane A, an additional amplifier 3A is established in software executing in a microprocessor (not shown). Preferably, this microprocessor is the same processor that realizes the plane regulator 5A, 5B and 5C. If the processor, by way of example, operates at a sampling frequency equal to 100 Hz, then the processor makes a read-out from the phase detector 2A every tenth millisecond. The value of the phase error from the phase detector 2A is multiplied with the gain of the additional amplifying block 3A. The gain of the additional amplifier 3A is set to zero at the time for the inclusion of plane C into a mutual regulation between plane A and C, and an increment is added to the value of the gain for each sample until the gain is equal to one. Then the additional amplifier 3A will be transparent since an amplification by one leaves the error signal uninfluenced, and the additional amplifier 3A is removed or disconnected. The above procedure is schematically illustrated in the flow diagram of FIG. 5. A corresponding procedure is preferably performed in plane B, when plane B is allowed to regulate towards the new plane C; an additional amplifier 3B is established and controlled similarly to the additional amplifier 3A in plane A. Naturally, other steps are also performed for each sample, such as sending the output of the additional amplifying block 3 to the summing block 4, sending the output of the summing block 4 to the regulator 5, generating a digital control signal in the regulator 5, and so on.

In one embodiment, the additional amplifiers 3 are established only temporarily, while in another embodiment, the additional amplifiers are provided permanently.

Briefly stated, the idea according to the first aspect of the invention is to gradually increase or increment, by successive addition, the value of the gain of the additional amplifying block 3 from zero to a value of one over a selectable period of time. In accordance with a preferred embodiment of the invention, this gradual and successive increase is effectuated in each one of the clock generating planes of the original clock system when an additional amplifying block 3 has been established therein.

Figure 6:
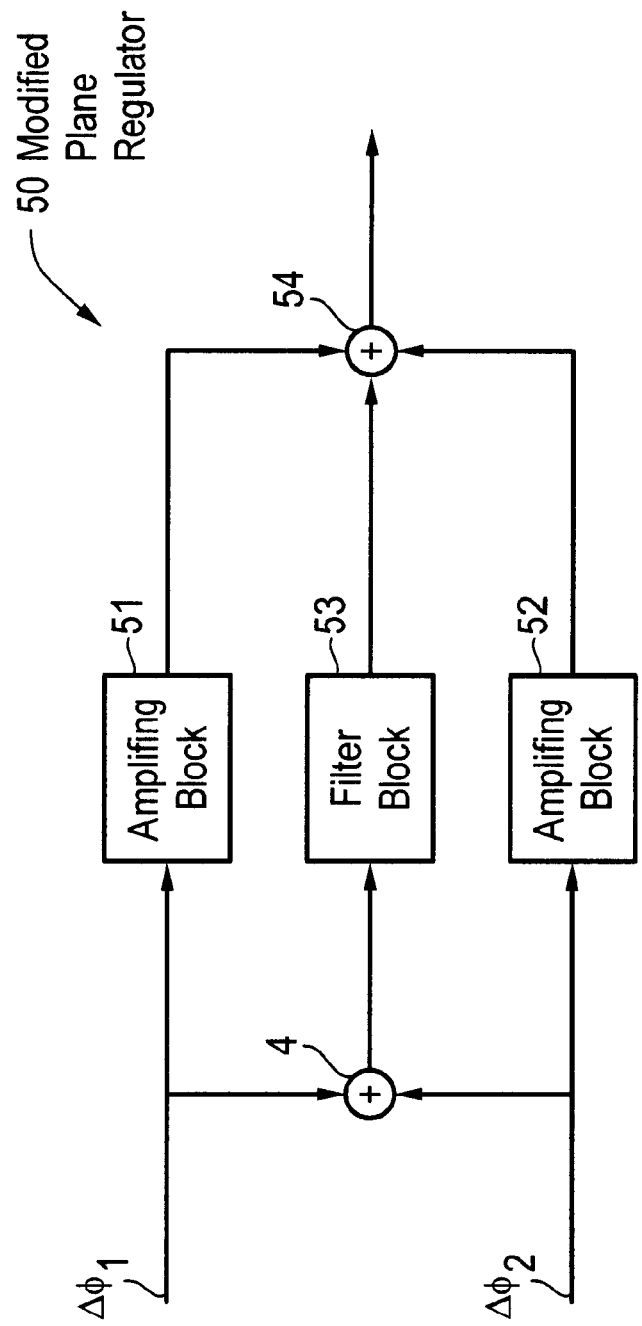
FIG. 6 is a schematic block diagram of a modified plane regulator in accordance with an alternative embodiment of the invention.

In this aspect of the invention, the increment is a positive constant value. In one embodiment of the invention, the increment is added to the value of the gain for each sample, although it may be added every second sample or every third sample. In fact, two successive additions may occur at times separated a selectable number of samples from each other. A reasonable period of time for incrementing the gain to its final value lies in the range between 1 to 100 seconds. It should be understood that the time period may be selected differently for different planes. However, the precise time required to reach the final value is not critical as long as the network synchronization regulator 25 can compensate for the relatively small increments that are successively introduced into the system. The principle of successive addition to smoothly include the further clock generating plane into the mutual clock system is more important. Alternatively, the additional amplifying block 3 is omitted and instead a modified plane regulator 50 illustrated in FIG. 6 is used. This regulator 50 includes two proportional paths 51, 52, one for each error signal ($\Delta\phi_1$ and $\Delta\phi_2$), and a common low-pass filter block 53 which is responsive to a signal which is representative of the sum of the two error signals, The two error signals are summed by summing block 4. The output signals of the proportionally amplifying blocks 51, 52 and the low-pass filter block 53 are added in a further summing block 54 to produce the digital control signal. In accordance with an alternative embodiment of the invention, the gain of the proportionally amplifying block 51/52 which is responsive to the error signal that is representative of the phase difference between the clock signal of the further included plane and the clock signal of the current plane, is gradually increased or incremented from zero to the final value which it should have in steady state. However, in this embodiment, the low-pass filter is required to have a time constant that is relatively long compared with the other time constants of the system. Fortunately, the time constant of the low-pass filter is readily dimensioned as desired. However, if the time period over which the gain is gradually incremented is selected to be relatively long, temporary stability problems may occur in this alternative embodiment of the invention if the low-pass filter block 53 is in operation from the time of the inclusion of the new plane. In some applications, the output signal of the active low-pass filter block 53 may dominate over the output signals of the proportional blocks 51, 52, so that the clock system turns oscillative. This is solved, in accordance with the invention, by delaying, in each one of the clock generating planes of the original clock system, the sending of the error signal, which is representative of the phase difference between the clock signal of the further included plane and the clock signal of the current plane, to the common low-pass filter block 53 until the gradually incremented gain is greater than some predetermined value. In other words, the error signal from the "new" phase detector is not sent to the low-pass filter block 53 until a certain period of time has elapsed. It is possible to perform the above step of delaying the error signal in only one of the clock generating planes of the original clock system.

In general, the first aspect of the invention is applicable to a situation in which the original clock system comprises a predetermined number, N, of clock generating planes, where N is a positive integer, and a further clock generating plane is included into the clock system. Thus, the clock system comprises N+1 clock generating planes after the inclusion. In particular, the original clock system may comprise only one plane; N=1. Moreover, the gradual increase of the gain of the additional amplifier 3 may be effectuated in, for example, only one of the N original planes, whereas other methods, such as the low-pass filter method described above, can be applied to the other planes of the original clock system. Besides, in the alternative embodiment, the final value of the gain may be selected to be different from plane to plane.

2) When a clock generating plane is pulled out of a mutually regulating clock system which, by way of example, comprises three clock generating planes, or when a plane breaks down or has a faulty condition, it will be excluded from the mutual regulation of the clock system.

Before the plane is excluded from the mutual regulation, there is an equilibrium, in which the whole system of mutually regulating planes will be found at a specific frequency, and in which every phase detector 1, 2 measures a specific phase difference. Although the clock system is in equilibrium, these measured phase differences are in general non-zero phase differences due to different characteristics of the involved components and cables, as mentioned above. Thus, when for example plane C is excluded from the mutual clock system, the phase difference between the clock signals of plane A and plane C, and the phase difference between the clock signals of plane B and plane C will be undefined. It is desirable to replace these undefined phase differences by suitable defined values so that a better control of the clock system is obtained. A possible solution would be to keep the phase difference values immediately prior to the exclusion of plane C, but it has turned out to be a distinct disadvantage to let the system remember values, since such values will become old and irrelevant history after a while. In addition, by successively excluding and including planes a plurality of times, very large values could be accumulated if non-zero values were kept in the system. A better alternative is to replace all the phase differences which are not defined by zero-values. In this way a more rigid control of the clock system is obtained, and uncontrolled accumulation of values is avoided.

However, by replacing the undefined phase differences, which generally are not equal to zero, by zero-values, a disturbance in the form of a phase step is introduced into the regulator 5 of the respective one of the remaining clock generating planes A and B. These phase steps will propagate through the clock system and generate transients in the system of mutually regulating clock generating planes, since the regulator 5, or parts thereof, in each one of the remaining planes has a time constant that is relatively short or zero. Normally, the regulators S include a proportional block 11 which immediately responds to the phase step, and generates a momentary frequency jump for the clock signal of the respective plane. This will alter the frequency of the whole clock system.

One possible way of solving the problem would, once again, be to low-pass filter, in plane A, the error signal representative of the phase difference between the clock signal of plane A and the clock signal of plane C, and, in plane B, the error signal representative of the phase difference between the clock signal of plane B and the clock signal of plane C. However, low-pass filtering requires a significant amount of processor power.

Figure 7:
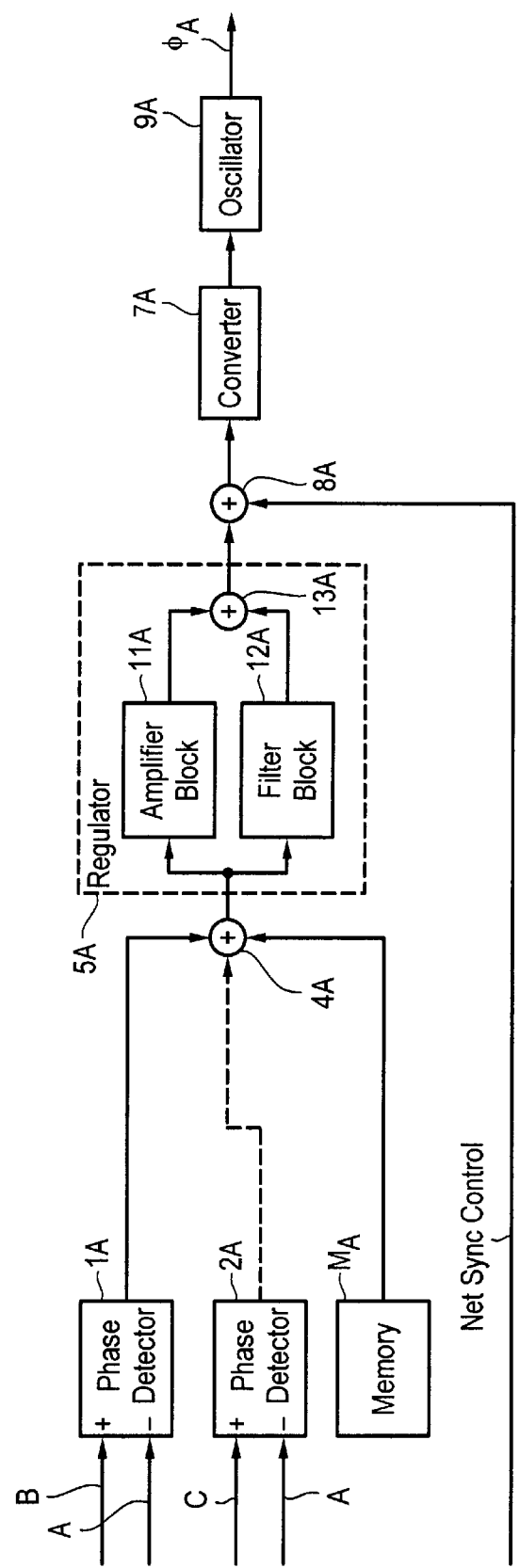
FIG. 7 is a schematic block diagram of a clock generating plane according to the invention, said plane comprising a memory.
Figure 8:
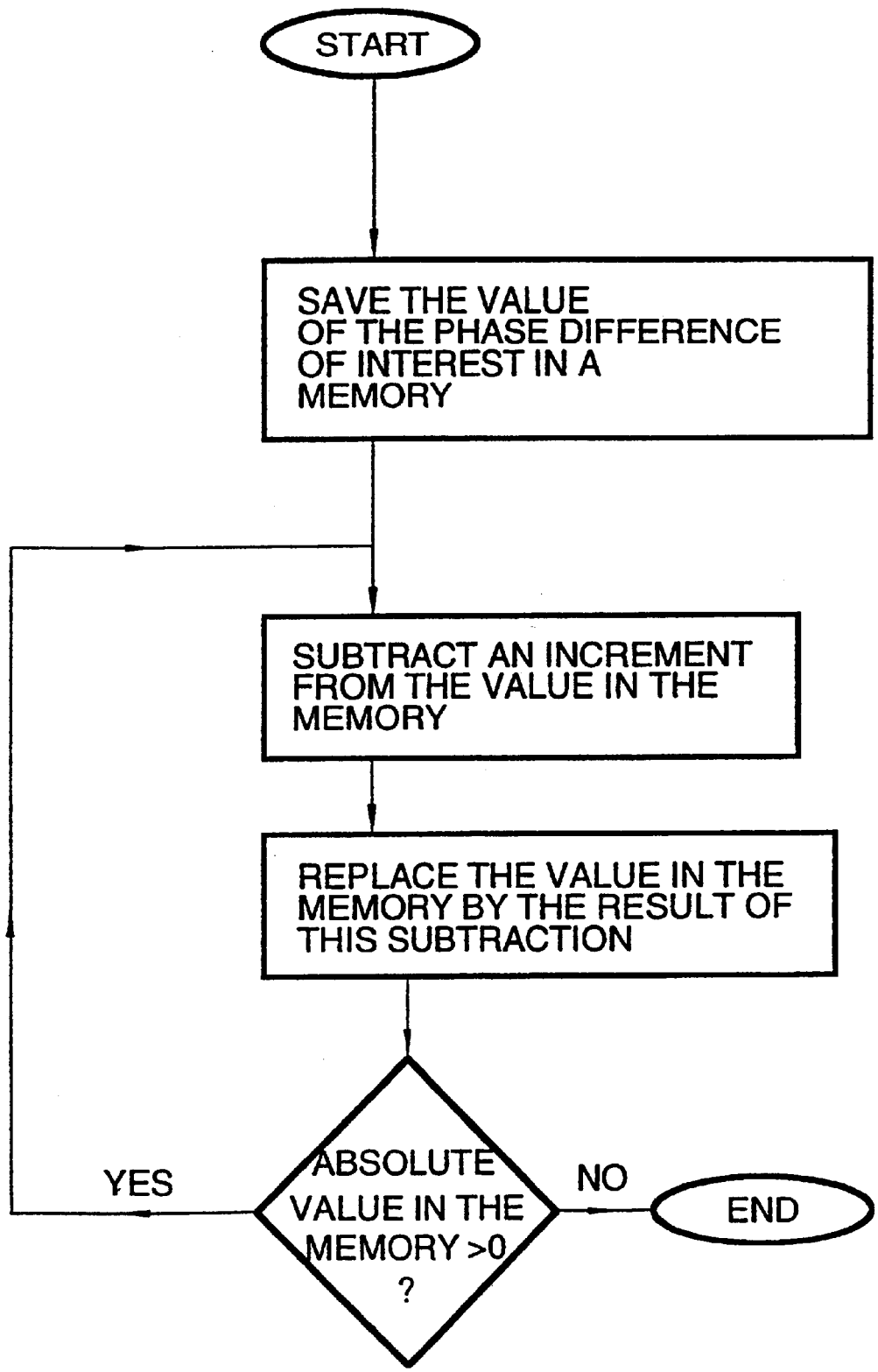
FIG. 8 is a schematic flow diagram illustrating a method for reducing transients in accordance with a second aspect of the invention.

FIG. 7 is a schematic block diagram of a clock generating plane (plane A in this example) in accordance with the present invention when the plane comprises a memory $M_A$, and when the output signal from the phase detector 2A is undefined (indicated by the broken line in FIG. 7) due to the exclusion of plane C. In accordance with a second aspect of the invention, the value of the error signal in plane A which is representative of the phase difference between the clock signal of plane A and the clock signal of plane C immediately prior to the exclusion of plane C, is saved in the memory, referred to as $M_A$. Subsequently, the following steps are preferably effectuated for each sample:

an increment is subtracted from the value held in the memory $M_A$; and the value held in $M_A$ is replaced by the result of this subtraction. This procedure goes on until the updated value held in $M_A$ has been decreased to zero. Thus, the value in $M_A$ is gradually decreased or decremented to zero by successively subtracting an increment from the continuously updated value in $M_A$. In general, it is assumed that the measured error signal value is a positive value, although a negative error signal value may occur. In the case of a negative value, the value in $M_A$ is gradually incremented to zero by successively adding a positive increment, or by successively subtracting a negative increment. The above procedure is schematically illustrated in the flow diagram of FIG. 8. The description of the above procedure, and the flow diagram of FIG. 8 are adapted so that a software implementation is easily realized. Of course, other steps are also performed for each sample; for example, the current value in $M_A$ is sent to the summing block 4A, and the regulator SA, which is responsive to the output signal from the summing block 4A, generates a digital control signal, and so on.

Correspondingly, the value of the error signal in plane B which is representative of the phase difference between the clock signal of plane B and the clock signal of plane C immediately prior to the exclusion of plane C, is saved in a memory, called $M_B$. The value in $M_B$ is gradually decreased or decremented to zero by successively subtracting an increment from the value and by successively updating the value in $M_B$ with the result of each subtraction.

In this way, the phase steps are smoothly introduced into the mutual regulation of the clock system, and transients are handled effectively. Moreover, at most, the solution in accordance with the invention requires one subtraction for each sample, whereas the low-pass filtering takes two multiplications for each sample.

In one embodiment of the invention, the increment is subtracted (or added to, in the case of a negative value) from the value in the memory and the memory is updated every sample, although it is possible to subtract the increment and to update the memory every second sample or every third sample. In fact, two successive sequences, each sequence including a subtraction and an updating, may occur at times separated a selectable number of samples from each other. In telecommunication applications, a reasonable period of time for decrementing the initial values in the memories to zero lies in the range between 1 to 100 seconds, although other time periods may be used.

Note that subtraction with a positive increment is equal to addition with a negative increment.

Naturally, it is also possible to apply the method in accordance with the second aspect of the invention to the regulator depicted in FIG. 4.

In general, the second aspect of the invention is applicable to a situation in which the original clock system comprises a predetermined number, M, of clock generating planes, where M is a positive integer, and a clock generating plane is excluded from the clock system. Thus, the clock system comprises M-1 clock generating planes after the exclusion. In particular, the original clock system may comprise two planes; M=2. In this case there will be only one remaining plane after the exclusion. Besides, it is possible to apply the successive subtraction procedure according to the invention to, for example, only one of the remaining planes, whereas other methods, such as the low-pass pass filter method described above, are utilized for the other remaining planes.

3) A third aspect of the invention, which in principle is generally based on the first and second aspect of the invention, is utilized to handle transients caused by a number of closely successive exclusions and inclusions of clock generating planes. The following example illustrates a possible scenario:

It is assumed that, initially, the clock system comprises three clock generating planes A, B and C, which regulate mutually towards each other, and that the whole system of mutually regulating planes is in equilibrium.

Figure 9:
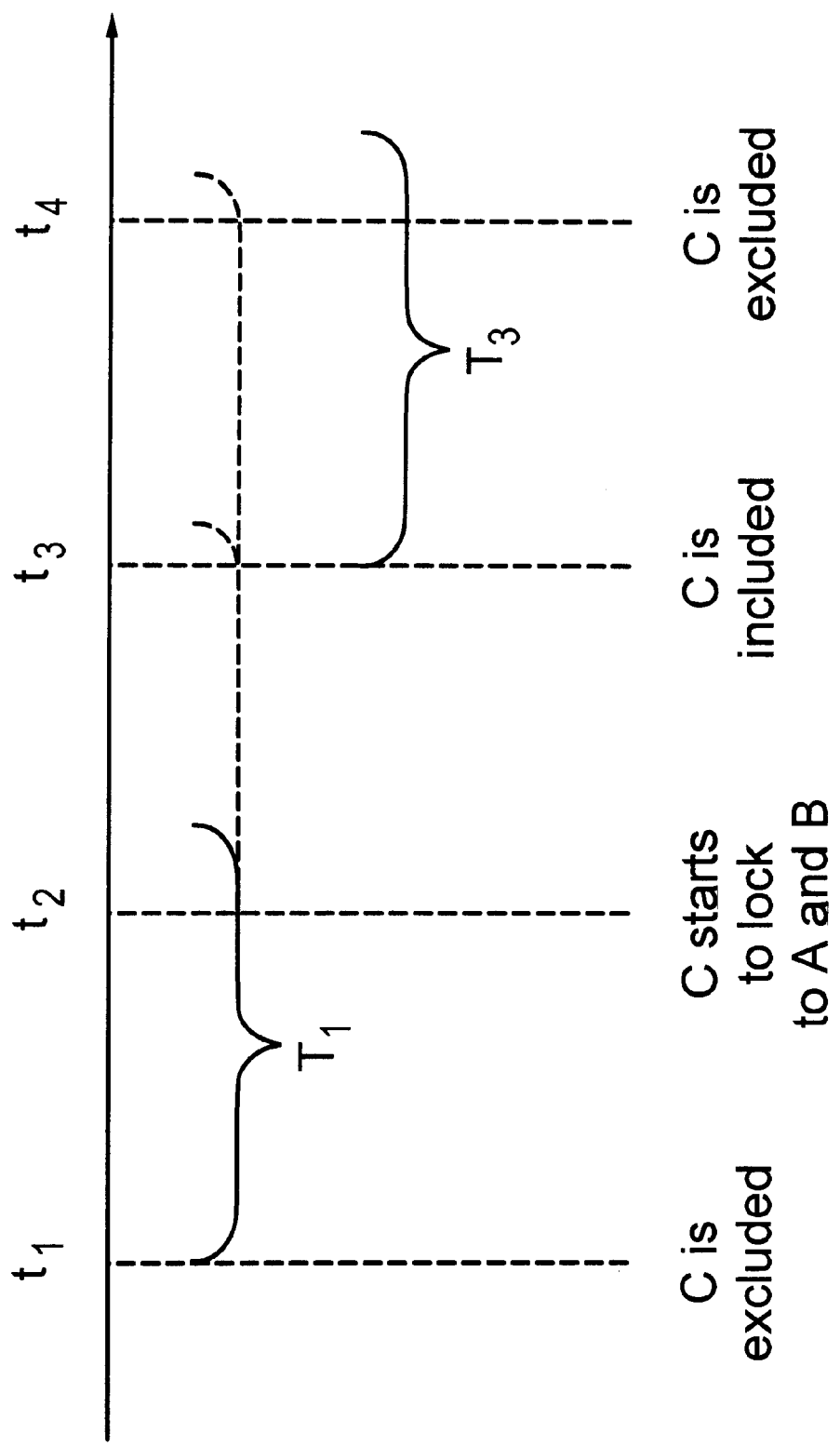
FIG. 9 illustrates a time axis, with some important occurrences marked thereon when closely (in time) successive inclusions and exclusions of clock generating planes are performed.
Figure 10:
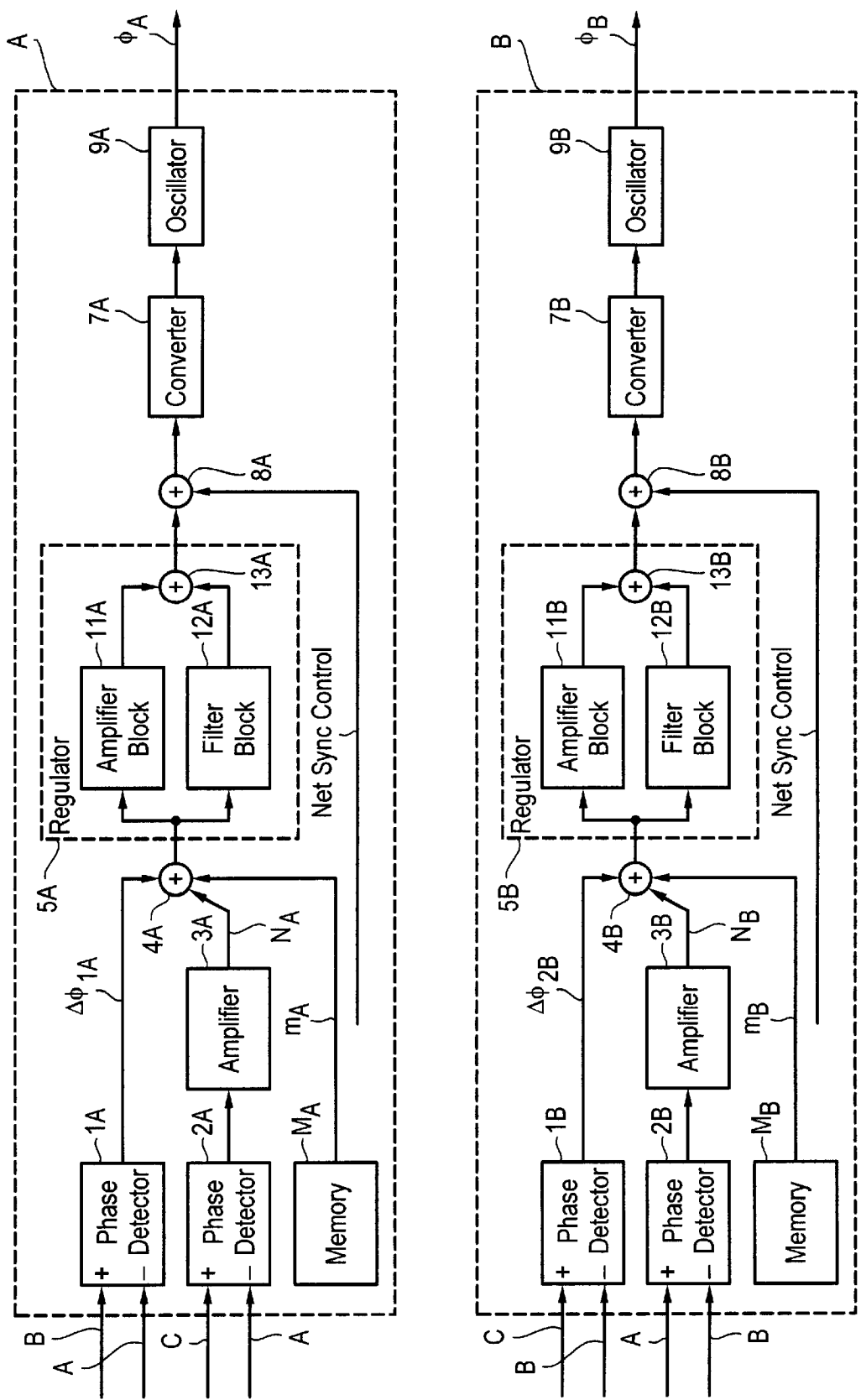
FIG. 10 is a schematic block diagram of two clock generating planes in a clock system, said clock system being illustrated only in part, when the two planes includes a memory and/or an additional amplifier.

FIG. 9 illustrates a time axis with the most important occurrences marked thereon when closely successive inclusions and exclusions of clock generating planes are performed. At the time $t_1$, plane C is excluded from the clock system. The value in the phase detector 2A of plane A, measured against plane C, immediately prior to the exclusion, is saved in memory $M_A$. The value in the phase detector 1B of plane B, measured against plane C, immediately prior to the exclusion, is saved in memory $M_B$. FIG. 10 is a schematic block diagram of two clock generating planes in a clock system, wherein each one of the two planes includes a memory and/or an additional amplifier. Note, that the clock system is illustrated only in part. For a complete illustration of the clock system reference must be made to FIG. 2 or 3. The value $m_A$ in memory $M_A$, and the value $m_B$ in memory $M_B$, are gradually decreased to zero by successively subtracting increments from the values in the memories and by successively updating the values in the memories with the result of each subtraction (see flow diagram of FIG. 8). The time required for the values to reach zero is determined by the initial value, the size of the increment and the sampling frequency of the system. Assume for simplicity that the value in $M_A$ and the value in $M_B$ both reach zero after a time interval $T_1$.

At time $t_2$ a C-plane is plugged into the cabinet and connected to the clock system. This C-plane can be a revised C-plane which will replace the old C-plane for upgrading reasons, or a plane which replaces a faulty C-plane. Next, the clock signal of the C-plane immediately starts to lock to the clock signal of plane A and the clock signal of plane B in frequency as well as phase.

At time $t_3$, it can be observed that the clock signal of plane C is synchronized with the clock signal of plane A and the clock signal of plane B with a required level of accuracy. This synchronization evaluation is preferably made both in plane A and plane B, independently of each other, which means that the time when plane C is accepted by plane A may differ from the time when plane C is accepted by plane B. However, for simplicity, assume that at time $t_3$ plane C is accepted or included into the mutually regulating clock system. Now, all the phase detectors in the whole clock system are active. In each one of the planes A and B, an additional amplifier 3A/3B is established between the output of the phase detector 2A/1B and the summing block 4A/4B. In particular, the additional amplifier 3A/3B is connected to the output of the phase detector which is responsive to the clock signal of the included C-plane and the clock signal of the respective one of the planes A and B. The value of the gain of the additional amplifiers 3A/3B is set to zero at the time for the inclusion of plane C, and a smooth and relatively slow inclusion of plane C into the mutual regulation with the respective one of the planes A and B is effectuated by successively adding a small increment to the value of the gain until it has reached the value of one (see flow diagram of FIG. 5). Assume that the gain of both of the additional amplifiers 3A, 3B is gradually increased to the value of one over a time interval $T_3$. Denote the value of the output signal of the respective additional amplifier 3A/3B by $N_A$ and $N_B$, respectively.

If $t_3 > t_1 + T_1$, then $M_A$ has already reached the value of zero, and, for each sample, the current $N_A$ is added to the current value, $\Delta\phi_{1A}$, of the output signal of the other phase detector 1A of plane A, and the resulting sum is sent into the regulator 5A of plane A. Correspondingly, $M_B$ is already zero and, for each sample, the current $N_B$ is added to the current value, $\Delta\phi_{2B}$, of the output signal of the other phase detector 2B in plane B, and the resulting sum is sent into the regulator 5B of plane B. These sums naturally change with time according to the gradual increase of the gain of the respective additional amplifier 3A/3B, and the change of $\Delta\phi_{1A}$ and $\Delta\phi_{2B}$.

If, on the other hand, $t_3 < t_1 + T_1$, then a fraction of the phase step introduced when plane C was excluded at $t_1$ still remains in the memories $M_A$ and $M_B$, wherein the values in these memories successively are being decreased. In this case, for each sample, the sum: $N_A + m_A + \Delta\phi_{1A}$ is sent to the regulator 5A of plane A, and the sum: $N_B + m_B + \Delta\phi_{2B}$ is sent to the regulator 5B of plane B, wherein these sums naturally change with time according to the gradual decrease of $m_A/m_B$, and the gradual increase of the gain of the respective additional amplifier 3A/3B, and the change of $\Delta\phi_{1A}$ and $\Delta\phi_{2B}$. In this way, both the phase step caused by excluding a plane from the clock system, and the phase step caused by including a plane into the system are effectively handled, although the transient reducing processes overlap each other in time.

At time $t_4$, however, plane C is excluded from the mutually regulating clock system once again. Assume, in this example, that $t_4<t_3+T_3$. If $t_4>t_1+T_1$, then the old values in the memories $M_A$ and $M_B$, due to the first exclusion at t1, are zero. The new value, due to a remaining phase difference, in the phase detector 2A of plane A, measured against plane C, immediately prior to the exclusion at t4, is saved in the memory $M_A$. The new value, due to a remaining phase difference, in the phase detector 1B of plane B, measured against plane C, immediately prior to the exclusion at t4, is saved in the memory $M_B$. The gain of the additional amplifiers 3A/3B is reset to zero so that the additional amplifiers 3A/3B are prepared when a C-plane is included into the system again. In one embodiment of the invention, the additional amplifiers 3A/3B are completely removed from the planes, and in case of a further inclusion of a C-plane, the additional amplifiers 3A/3B are re-established. However, the values output from the additional amplifiers 3A/3B immediately prior to the reset of the gain has to be taken care of, otherwise the reset will generate transients. Therefore, in plane A, $N_A$ is added to the current value in $M_A$ and the result is saved in memory $M_A$. In plane B, $N_B$ is added to the current value in $M_B$ and the result is saved in memory $M_B$. To transfer signal strength in this way will not generate transients. Thereafter, for each sample, the current value in memory $M_A$ is added to the current value, $\Delta\phi_{1A}$, of the output signal of the other phase detector 1A of plane A, and the resulting sum is sent into the regulator SA of plane A. Correspondingly, for each sample, the current value in memory $M_B$ is added to the current value, $\Delta\phi_{2B}$, of the output signal of the other phase detector 2B in plane B, and the resulting sum is sent into the regulator 5B of plane B. Of course, these resulting sums change with time according to the gradual decrease of the respective values in $M_A$ and $M_B$, and the change of $\Delta\phi_{1A}$ and $\Delta\phi_{2B}$.

If $t_4<t_1+T_1$, then the old values in the memories $M_A$ and $M_B$, due to the first exclusion at t1, have not yet been decremented to zero. Therefore, the new values, due to remaining phase differences, of plane A and plane B, in their respective phase detector 2A/1B, measured against plane C, immediately prior to the exclusion of plane C at $t_4$, are added to the old values in memory $M_A$ and $M_B$, respectively. The result of these additions are saved in memory $M_A$ and M., respectively. In addition, the additional amplifiers 3A, 3B are reset to zero or removed from the planes. Moreover, in plane A, $N_A$ is added to the current value in $M_A$ and the result is saved in memory $M_A$. In plane B, $N_B$ is added to the current value in $M_B$ and the result is saved in memory $M_B$. Thereafter, for each sample, the current value in memory $M_A$ is added to the current $\Delta\phi_{1A}$ and the sum is sent into the regulator 5A of plane A. Correspondingly, for each sample, the current value in memory $M_B$ is added to the current $\Delta\phi_{2B}$ and the sum is sent into the regulator 5B of plane B.

Of course, other scenarios are possible, such as further inclusions and exclusions and/or different time intervals, but the preceding example clearly illustrates the underlying principles according to the invention which can be used to handle transients when clock generating planes are excluded and/or included in close succession.

Figure 11:
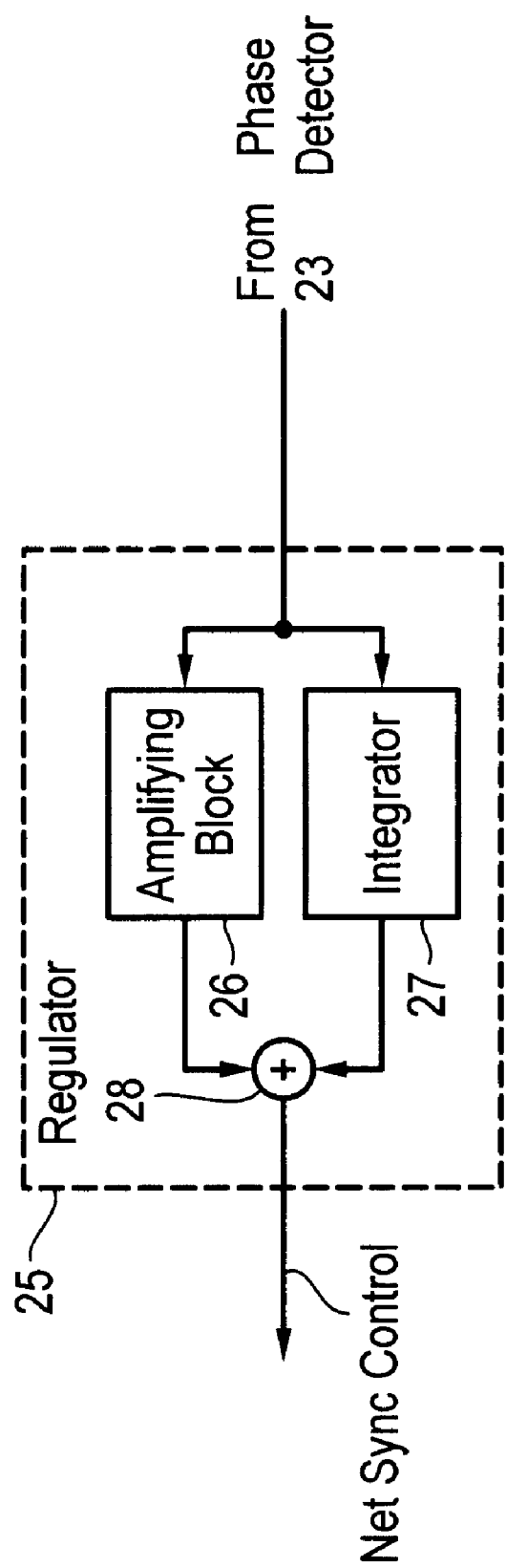
FIG. 11 is a schematic block diagram of a network synchronization regulator in accordance with the invention.

4) FIG. 11 is a schematic block diagram of a network synchronization regulator 25 according to one embodiment of the invention. In this embodiment, the regulator 25 is implemented in software executing in a microprocessor. The network synchronization regulator 25 is responsive to the output signal from the phase detector 23, and, in general, the regulator 25 comprises a proportionally amplifying block 26 and an integrator 27, which are connected in parallel. Both the amplifying block 26 and the integrator 27 are responsive to the node error signal of the phase detector 23. The output signal of the amplifying block 26, and the output signal of the integrator 27 are added together in a summing block 28 to provide a network synchronization control signal. The amplifying block 26 responds immediately to the node error signal, whereas the integrator 27 responds relatively slowly to the node error signal from the phase detector 23.

Preferably, there is provided a network synchronization regulator 25 in each one of the planes in the clock system, as is illustrated in FIG. 3. The node error signal from the phase detector 23 is distributed via signalling paths to each one of the regulators 25A, 25B and 25C. In each plane, the network synchronization regulator 25 produces a control signal which is sent to the second summing block 8 to influence the frequency of the output clock signal of the plane. In this way, the clock signal of the respective one of the clock signal generating planes will be synchronized with the network reference signal NRS. The clock selector 21 normally rotates cyclically between the clock signals of the clock generating planes of the clock system at a predetermined rate, so that the frequency of the output clock signal SCS of the clock selector 21 can be regarded as a time-multiplexed mean value of the frequencies of the different planes. The clock signal SCS of the whole clock system will also be synchronized to the network reference signal NRS.

When the network synchronization is to be activated in the clock system, it has turned out to be a general problem of synchronizing, in time, the start of the network synchronization regulator 25 (25A, 25B, 25C) in the different clock generating planes. The network synchronization should start at the same time in all the clock generating planes. When the network synchronization regulator 25 is activated there may be a non-zero output signal from the phase detector 23. This output signal is immediately amplified by the amplifying block 26 in the regulator 25, whereas the integrator 27 begins its relatively slow charging process. At the beginning of the network synchronization, the output signal of the amplifying block 26 gives the main contribution to the network synchronization control signal. If, by way of example, the network synchronization regulator 25 does not start at the same time in plane A as in plane B, the output signal from the proportionally amplifying block 26A (not shown) in the regulator 25A may have influenced the frequency of the clock signal of plane A for a duration of time before the output signal from the proportionally amplifying block 26B (not shown) in the regulator 25B starts to influence the frequency of the clock signal of plane B. Subsequently, the frequency of the clock signal of plane A will differ from the frequency of the clock signal of plane B. Although, the plane regulator 5, in the mutual regulation between the planes, will try compensate for this undesired frequency change, the phase difference between the clock signal of plane A and the clock signal of plane B will, in general, increase. It is important to understand that the frequency change between plane A and plane B due to the unsynchronized activation of the network synchronization regulators 25A, 25B, 25C is undesired, whereas a frequency change of each plane due to the network synchronization itself is desired.

If the phase difference between the clock signal of plane A and the clock signal of plane B becomes larger than what is accepted by the quality control of the clock selector, problems which are difficult to administrate will occur, and in the worst case, transmission slip may occur. In addition, the frequency of the whole clock system may be altered in an uncontrolled manner.

Furthermore, if a number of clock generating planes are regulating mutually towards each other in a steady state operation, and the clock signals of the planes are synchronized to the network reference signal NRS, and a further plane is to be included into the system, at least two transients will be introduced to the system:

First, the inclusion of the further plane into the mutual regulation of the original clock system will generate a first transient. This first transient is effectively handled by applying the first aspect of the invention to the clock system, as described above.

Second, when the new plane starts to synchronize to the NRS-signal a second transient may occur. If the phase difference between the SCS-signal and the NRS-signal is not zero, which may happen although the system is in steady state, then this non-zero phase difference will propagate through the network synchronization regulator 25 of the new plane and generate a transient because of the amplifying block 26 in the regulator 25.

In accordance with a fourth aspect of the present invention, a method for reducing transients associated with the network synchronization is proposed. In a preferred embodiment of the invention, the gain of the amplifying block 26 in the regulator 25 is set to zero at the time of the activation of the network synchronization. Next, the gain of the amplifying block 26 is gradually increased or incremented to the value which the gain of the amplifying block 26 should have in steady state.

The control of the gain of the amplifying block 26 in the regulator 25 is effectuated in only one plane, in a number of planes or in all of the planes depending upon the particular situation under consideration. Above, there is described two different scenarios. In the first one, there are three network synchronization regulators 25, one in each plane, which are to be activated. Preferably, the control of the gain of the amplifying block 26 in the regulator 25 is effectuated in all of the planes. Naturally, it is possible to utilize other methods, such as a low-pass filter method as the one described above, in some of the planes, whereas the method in accordance with the fourth aspect of the invention is applied to the other plane(s) in the clock system. In the second scenario, a number of planes are already in steady state operation, and, furthermore, synchronized to the network synchronization reference signal NRS. In this case, the control of the gain of the amplifying block 26 is performed in the new plane when the network synchronization regulator 25 in that plane is activated.

More specifically, the gradual increase of the gain is accomplished by successively adding an increment to the value of the gain of the amplifying block 26 provided in the network synchronization regulator 25 until the value of the gain has been increased from zero to its final value over a selectable period of time.

In this way, the difference between the control signals to the voltage controlled oscillators of the clock generating planes will be reduced, and the clock system will be more tolerant to unsynchronized activation of the network synchronization. Furthermore, the above problem is solved in accordance with the fourth aspect of the invention by using a minimum of processor power.

In one embodiment of the invention, the increment is added to the value of the gain for each sample, although it may be added every second sample or every third sample. In fact, two successive additions may occur at times separated a selectable number of samples from each other. A reasonable period of time for incrementing the gain to its final value lies in the range between 1 to 100 seconds.

If the respective regulator 25 is mounted on the same circuit board as the other components of the respective plane is irrelevant, as long as the respective regulator 25 is connected to or otherwise associated with the respective plane.

As will be understood by those skilled in the art, the fourth aspect of the invention is very similar to the first aspect of the invention.

The fourth aspect of the invention is generally applicable to a situation in which the clock system comprises a predetermined number, K, of clock generating planes, and in which there are L network synchronization regulators, where K and L are positive integers. Preferably, in steady state, K is equal to L.

The embodiments described above are merely given as examples, and it should be understood that the present invention is not limited thereto. It is of course possible to embody the invention in specific forms other than those described without departing from the spirit of the invention. Further modifications and improvements which retain the basic underlying principles disclosed and claimed herein are within the scope and spirit of the invention.

What is claimed is:

1. In a clock signal generating system comprising a predetermined number, N, of clock signal generating planes, where N is a positive integer, a method for reducing transients said method comprising the steps of:

including a further clock signal generating plane into said clock signal generating system: and gradually incrementing, in at least one of said N clock signal generating planes, the gain of amplifying means provided in the respective one of said at least one of said N clock signal generating planes for amplifying a signal representative of a difference in phase between the clock signal of said included further clock signal generating plane and the clock signal of the respective one of said at least one of said N clock signal generating planes, from a respective first value to a respective second value over a respective first period of time.

2. A method for reducing transients in accordance with claim 1, wherein N is equal to 1.

3. A method for reducing transients in accordance with claim 1 further comprising the step of:

synchronizing, prior to inclusion, the clock signal of the further clock signal generating plane to be included with the clock signal of the respective one of said at least one of said N clock signal generating planes so that, at most, a small static phase difference between the clock signal of the clock signal generating plane to be included and the clock signal of the respective one of said at least one of said N clock signal generating planes exists.

4. A method for reducing transients in accordance with claim 1 further comprising the step of:

delaying, in at least one of said N clock signal generating planes, the sending of an error signal, which is representative of a phase difference between the clock signal of the further included plane and the clock signal of the respective one of said at least one of said N clock signal generating planes, to a low-pass filter provided in the respective plane until the gain of the respective one of said amplifying means is greater than a third predetermined value.

5. A method for reducing transients in accordance with claim 3 further comprising the step of:

delaying, in at least one of said N clock signal generating planes, the sending of an error signal, which is representative of a phase difference between the clock signal of the further included plane and the clock signal of the respective one of said at least one of said N clock signal generating planes, to a low-pass filter provided in the respective plane until the gain of the respective one of said amplifying means is greater than a third predetermined value.

6. A method for reducing transients in accordance with claim 1, wherein said included further clock signal generating plane and said N clock signal generating planes form a mutually regulating clock signal generating system.

7. In a telecommunication network, a method for reducing transients said method comprising the steps of:

including a further clock signal generating plane into a clock signal generating system comprising a predetermined number, N, of clock signal generating planes, where N is a positive integer; and successively adding, in at least one of said N clock signal generating planes, an increment to the gain of amplifying means provided in the respective one of said at least one of said N clock signal generating planes for amplifying a signal representative of a differences in phase between the clock signal of said included further clock signal generating plane and the clock signal of the respective one of said at least one of said N clock signal generating planes, until the gain has been increased from one value to another value over a period of time.

8. In a clock signal generating system comprising a predetermined number, M, of clock signal generating planes, where M is a positive integer, a method for reducing a transient said method comprising the steps of:

excluding a clock signal generating plane from said clock signal generating system; and gradually decrementing, in at least one of the remaining clock signal generating planes, from a respective first value a respective digital signal value which is representative of a phase difference immediately prior to exclusion, to a respective second value over a respective period of time.

9. In a clock signal generating system comprising a predetermined number, M, of clock signal generating planes, where M is a positive integer, a method for reducing transients said method comprising the steps of:

excluding a clock signal generating plane from said clock signal generating system; and gradually decrementing, in at least one of the remaining clock signal generating planes, a respective digital signal value which is representative of the phase difference, immediately prior to exclusion, between the clock signal of the respective one of the remaining clock signal generating planes and the clock signal of the clock signal generating plane to be excluded, from a respective first value to a respective second value over a respective period of time.

10. A method for reducing transients in accordance with claim 9, wherein M is equal to 2, and there is only one remaining clock signal generating plane after exclusion.

11. A method for reducing transients in accordance with claim 9, wherein said digital signal value, which is being gradually decremented, is sent to a regulator provided in at least one of the remaining clock signal generating planes.

12. A method for reducing transients in accordance with claim 9, wherein said digital signal value is representative of said phase difference being amplified by amplifying means provided in at least one of said remaining clock signal generating planes.

13. A method for reducing transients in accordance with claim 9, wherein said M clock signal generating planes form a mutually regulating clock signal generating system.

14. In a telecommunication network, a method for reducing transients said method comprising the steps of:

excluding a clock signal generating plane from a clock signal generating system comprising a predetermined number, M, of clock signal generating planes, where M is a positive integer; and successively subtracting, in at least one of the remaining clock signal generating planes, an increment from a respective digital signal value which is representative of the phase difference, immediately prior to exclusion, between the clock signal of the respective one of the remaining clock signal generating planes and the clock signal of the clock signal generating plane to be excluded, until the respective digital signal value has been decreased from a respective first value to a respective second value over a respective period of time.

15. In a clock signal generating system comprising a predetermined number, M, of clock signal generating planes, where M is a positive integer, a method for reducing a transient said method comprising the steps of:

excluding a clock signal generating plane from said clock signal generating system; and gradually incrementing, in at least one of the remaining clock signal generating planes, a respective digital signal value which is representative of a phase difference immediately prior to exclusion, from a respective first value to a respective second value over a respective period of time, provided that said phase difference immediately prior to exclusion is negative.

16. In a clock signal generating system comprising a predetermined number, M, of clock signal generating planes, where M is a positive integer, a method for reducing transients said method comprising the steps of:

excluding a clock signal generating plane from said clock signal generating system; and gradually incrementing, in at least one of the remaining clock signal generating planes, a respective digital signal value which is representative of the phase difference, immediately prior to exclusion, between the clock signal of the respective one of the remaining clock signal generating planes and the clock signal of the clock signal generating plane to be excluded, from a respective first value to a respective second value over a respective period of time, provided that said phase difference immediately prior to exclusion is negative.

17. In a clock signal generating system comprising a predetermined number, K, of clock signal generating planes, where K is a positive integer, a method for reducing transients said method comprising the steps of:

activating a predetermined number, L, of network reference synchronization regulators, each regulator being used for synchronizing a clock signal of an individual one of said K clock signal generating planes with a reference clock signal; and gradually incrementing, in at least one of said L network reference synchronization regulators, the gain of amplifying means provided in the respective one of said at least one of said L network reference synchronization regulators for amplifying a signal representative of a difference in phase between the reference clock signal and a selected one of the clock signals from said clock signal generating, planes, from one value to another value over a period of time.

18. In a clock signal generating system comprising a predetermined number, K, of clock signal generating planes, where K is a positive integer, a method for reducing a transient said method comprising the steps of:

activating a synchronization of the clock signal of the clock signal generating system to a reference clock signal; and gradually incrementing, in at least one of said K clock signal generating planes, the gain of amplifying means provided in a network reference synchronization regulator for amplifying a signal representative of a difference in phase between the reference clock signal and the clock signal of the clock signal generating system, from one value to another value over a period of time.

* * * * *